(12) United States Patent
Becker et al.

(10) Patent No.: US 6,337,649 B1
(45) Date of Patent: Jan. 8, 2002

(54) COMPARATOR DIGITAL NOISE FILTER

(75) Inventors: Jeff Becker, Goleta; Robert Curby, Thousand Oaks; Tim Richmond, Woodland Hills; George H. McCammon, Moorpark, all of CA (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/536,565

(22) Filed: Mar. 28, 2000

(51) Int. Cl.[7] .............................................. H03K 5/1536
(52) U.S. Cl. ............................. 341/155; 327/34; 327/37
(58) Field of Search .............................. 327/34–37, 551, 327/552, 77, 78, 79, 80, 81, 89; 341/155, 156, 158, 164, 165

(56) References Cited

U.S. PATENT DOCUMENTS

| | | | | |
|---|---|---|---|---|
| 4,775,840 A | * | 10/1988 | Ohmori et al. | 327/34 |
| 5,680,265 A | * | 10/1997 | Noguchi | 327/37 |
| 5,737,140 A | * | 4/1998 | Carr | 327/37 |
| 5,907,299 A | * | 5/1999 | Green et al. | 341/155 |
| 6,169,765 B1 | * | 1/2001 | Holcombe | 327/37 |
| 6,218,870 B1 | * | 4/2001 | Wilson | 327/34 |

* cited by examiner

Primary Examiner—Tuan T. Lam
(74) Attorney, Agent, or Firm—Price & Gess

(57) ABSTRACT

Spurious pulses are eliminated in the output of a comparator performing analog to digital conversion by addition of logic which eliminates pulses having a width less than a selected width from the output of the comparator.

9 Claims, 3 Drawing Sheets

COMPARATOR DIGITAL NOISE FILTER

This invention was made with support under Prime Contract #F04701-95-C-0017 awarded by the U.S. Department of the Air Force, HQ Space and Missile System Center (AFMC). The Government of the United States of America has certain rights in this invention.

BACKGROUND OF THE INVENTION

1. Field of the Invention

The subject invention relates generally to analog to digital signal conversion and more particularly to a method and apparatus operable on the output of a comparator to provide increased accuracy in the face of noise.

2. Description of Related Art

As illustrated in FIG. 1, conversion of an analog signal to a digital pulse train normally employs a comparator 11 and various analog signal processing such as analog pre-filtering 13 combined with hysterisis 15. Noise may be introduced at the input to the comparator 11, as symbolically represented at adder 17, or after analog pre-filtering, as symbolically represented at adder 19. Errors in the output pulse train result when such noise-induced error exceeds any hysterisis processing and filtering contained in the comparator 11. In cases where an extremely high pulse rate is required, such noise compromises the bandwidth and phase of the analog to digital conversion performed by the comparator 11.

SUMMARY OF THE INVENTION

According to the invention, a pulse filter is provided which prevents a pulse having a width less than a specified time duration from propagating into the pulse train at the output of the comparator. The invention operates on the output of any comparator circuit and provides a minimum pulse width rejection of any pulse which may result from noise that sets or resets the comparator. This pulse width rejection can be programmable or designed directly into the hardware/software/firmware such that a pulse less than a specified time duration will not be allowed to propagate into the pulse train.

BRIEF DESCRIPTION OF THE DRAWINGS

An illustrative embodiment of the just summarized invention will now be described in detail in conjunction with the drawings of which.

DETAILED DESCRIPTION OF THE PREFERRED EMBODIMENTS

Figure 1:
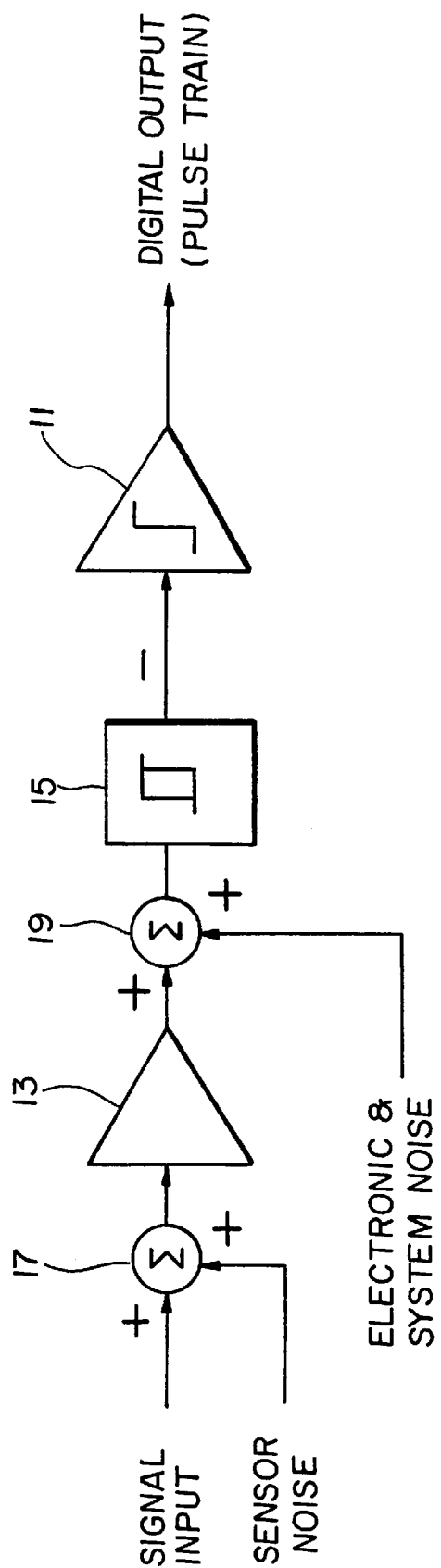
FIG. 1 is a block diagram illustrating prior art comparator circuitry.
Figure 2:
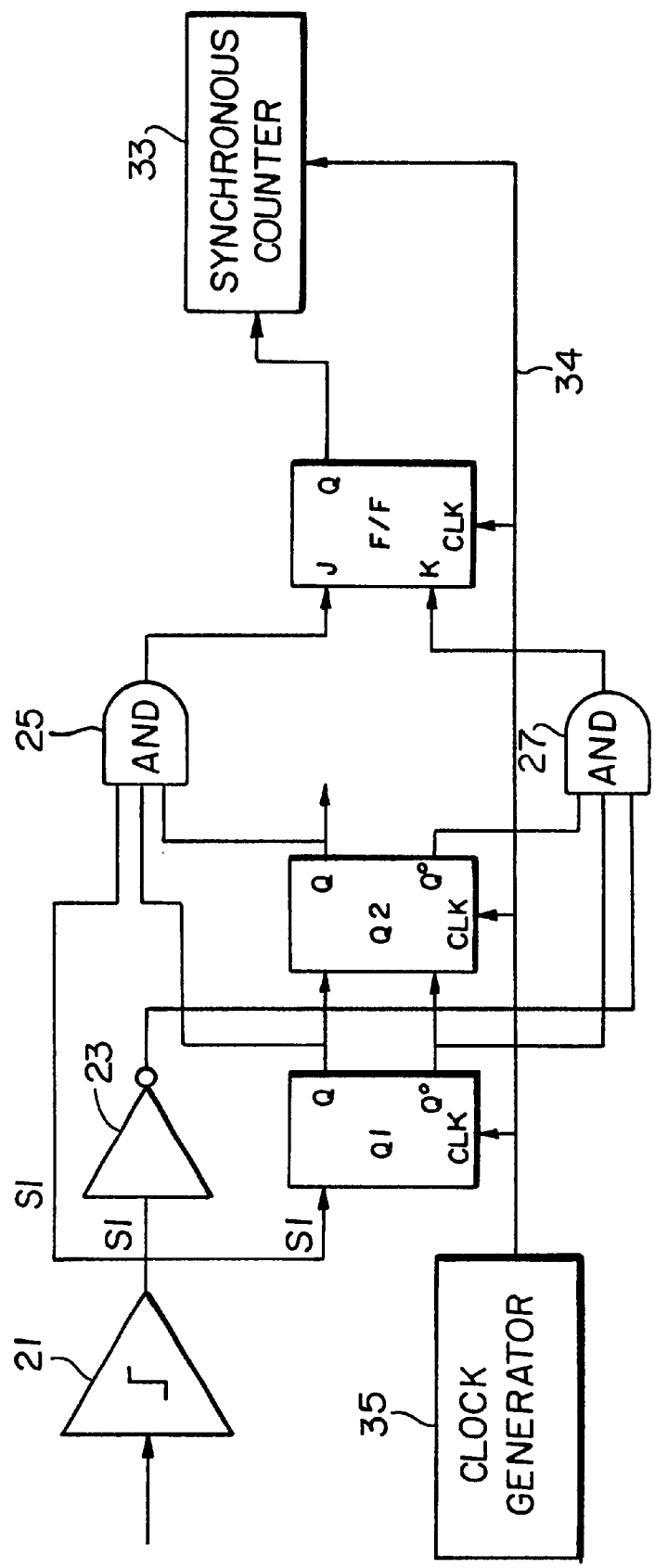
FIG. 2 is a circuit schematic of circuitry according to the preferred embodiment of the invention.

Logic according to the preferred embodiment is illustrated in FIG. 2. While such logic is illustrated in the form of digital logic componentry, those skilled in the art will appreciate that such logic may be readily implemented in other forms such as software or firmware.

According to the diagram of FIG. 2, the output signal S1 of a comparator 21 provides an input to an inverter amplifier 23, a first delay element Q1, and an AND gate 25. The AND gate 25 receives second and third inputs from the output of the first delay element Q1 and the output of a second delay element Q2, respectively.

The output of the first delay element Q1 and is also input to the second delay element Q2. Thus, two stages of several delay are provided in the embodiment of FIG. 2.

A second AND gate 27 receives the output of the inverter 23 as a first input, and the respective inverted outputs of the delay elements Q1 and Q2 as second and third inputs. The output of the first AND gate 25 is supplied to the J input of JK flip-flop F/F, while the output of the second AND gate 27 is fed to the K input of the flip-flop F/F. The Q output of the flip-flop F/F forms the output of the circuit and is shown being supplied to a synchronous counter 33. The delay elements Q1 and Q2; JK flip-flop F/F and the synchronous counter 33 each receive a clock signal input provided on signal line 34 from a clock generator 35.

With respect to operation of the logic of FIG. 2, the comparator 21 is asynchronous and may change state at anytime. The outputs of each of the delay elements Q1 and Q2 are a function of the state of their input at the clock edge and generate one (Q1) and two (Q2) clock delay synchronous copies of the output of the comparator 21. The outputs of the delay elements Q1 and Q2 can only change state at the clock edge. As a result, the output of the comparator 21 is clocked into the first delay element Q1 at each clock interval. This manner of operation synchronizes the comparator timing and forces the Q1 output waveform to always be an integral number of sample clocks.

As shown in FIG. 2, an "And" function of the three inputs S1, Q1 and Q2 is formed and provides the J input to the flip/flop F/F, which then operates as a valid pulse generating circuit. The output F/F logic functions of the flip-flop F/F are as follows:

$$J = Q1 \ \& \ Q2 \ \& \ \text{Input}$$

$$K = Q1^* \ \& \ Q2^* \ \& \ \text{Input}$$

In the above equations, $Q1^*$ and $Q2^*$ are the inverted binary values of Q1 and Q2, respectively.

If the comparator 21 resets as a result of a narrow pulse noise spike before the next clock, the delay element Q1 will be set to False and the delay element Q2 will be set to True. Therefore, in the case where Q1 has been set False and Q2 has been set True, the "J" logic equation is not satisfied. Thus, the Output F/F remains in the reset state and the noise pulse does not appear on the Q output of the JK flip-flop F/F.

In the case that the comparator 21 receives an input pulse which is wider than 2 clock periods, the delay element Q1 sets True on the first clock, the delay element Q2 sets True on the second clock, and Q1 and the Input remain True at the second clock. As a result, according to the J logic function above, the Q output of the JK flip-flop F/F will set to True.

Figure 3:
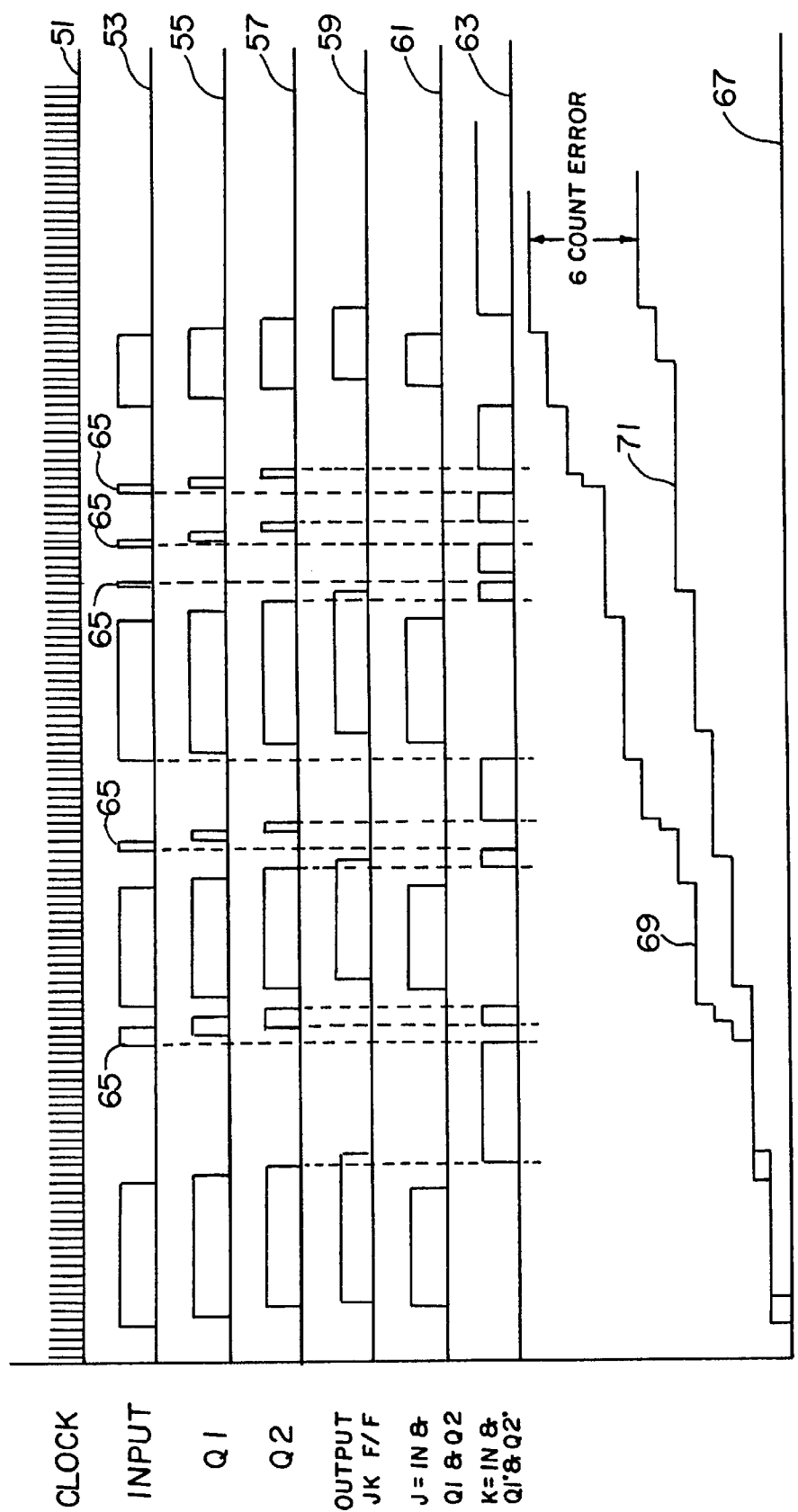
FIG. 3 is a waveform diagram usefull in illustrating operation of the preferred embodiment.

FIG. 3 illustrates the results of the introduction of noise to the comparator 21 for the mechanization shown in FIG. 2. In particular, FIG. 3 graphs the clock signal on signal line 34 on a first horizontal axis 51; the output signal S1 of the comparator 21 on a second horizontal axis 53; the Q1 and Q2 outputs on respective axes 55, 57; and the J and K logic functions and Q output of the flip flop F/F on respective axes 59, 61, 63. Spurious noise pulses 65 in the comparator output S1 are also shown, as well as their propagation through and elimination by the logic of the preferred embodiment. From FIG. 3 it can be seen that the valid comparator pulses which are propagated through the filter are delayed by two clock periods.

The synchronous pulse count accumulated by the counter 33 of FIG. 2 is shown above the bottom line 67 of FIG. 3. The solid line 69 is the pulse count without the filter logic of the preferred embodiment, and dashed line 71 is the pulse count obtained with the filter. These results shows that the unfiltered count 69 is in error by 6 counts, while the filtered output 71 has rejected all of the noise pulses and only propagated the actual valid counts.

The just-described pulse filter approach ignores any pulses that are present on the output of the comparator 21 which are less than the number of synchronous clocks. The filter shown in FIG. 2 will reject any error pulse which is less than 1 clock period and may reject pulses that are as wide as (2-ε), depending on the relationship of the asynchronous rise and fall time of the comparator to the synchronous clock. The period of a rejected pulse is adjustable by use of a clock generator or programmable clock source which varies the frequency of the synchronous clock. As the frequency varies, the time period of the clock pulse width also varies, thus changing the noise pulse rejection period. As an example, using a 1 MHz clock, a noise pulse width of ε to 1 μsec would always be rejected, and noise pulses from >1 to 2 usec would also be rejected, depending on the timing of the asynchronous rise and fall time to the clock. If the clock frequency were changed to 2 MHz the noise pulse width rejection would be reduced by a factor of 2.

Logic according to the invention can be expanded to add Q3 to Q(n) delay elements and to add n states to the input of the AND function. With this expansion of states, rejection of pulse widths from 2 to (n-1) pulse widths can be achieved. The entire filter mechanization is compatible with real time pulse width rejection modification by providing a programmable clock generator or programmable counter and appropriate AND logic states.

From the above description, those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. An apparatus comprising:

a comparator amplifier providing a digital pulse train of pulses from an analog signal; and logic means operative on the pulses to eliminate spurious pulses, said logic means including means for delaying a first and second of said pulses; and first means for performing a logic operation on the first and second of the said pulses and a third of said pulses.

2. The apparatus of claim 1 wherein said logic means operates to prevent a pulse having a width less than a selected width from appearing in said pulse train.

3. The apparatus of claim 1 wherein said logic operation is an AND logic function.

4. The apparatus of claim 1 further including second means for performing a logic operation on inverted forms of said first, second and third pulses.

5. The apparatus of claim 4 wherein said first and second means each comprise an AND gate.

6. An apparatus comprising:

a comparison circuit arranged to receive analog signal input and produce a digital pulse train output; and a digital logic circuit connected to receive the digital pulse train, said logic circuit including first and second delay elements, the first delay element receiving the output of said comparison circuit and supply an output to the second delay element, and a first AND gate and a second AND gate, the first AND gate being connected to receive respective inputs comprising said pulse train output and respective outputs from said first and second delay elements, the second AND gate receiving a plurality of inputs which include the inverted form of each of said respective inputs.

7. The apparatus of claim 6 wherein respective outputs of said first and second AND gates are connected to respective J and K inputs of a J-K flip-flop.

8. An apparatus comprising:

a comparison circuit arranged to receive an analog signal input and to produce a digital pulse train output; and a digital logic circuit having first and second delay elements, the first delay element receiving the output of the comparison circuit, the logic circuit performing the logic functions:

$J = Q1 \ \& \ Q2 \ \& \ \text{Input}$ $K = Q1^* \ \& \ Q2^* \ \& \ \text{Input}$ where Q1 and Q2 are values stored by said first and second delay elements respectively, and "Input" is the binary value of the present pulse at the output of said comparison circuit.

9. An apparatus comprising:

a comparison circuit for producing a digital pulse train from an analog signal; and a logic circuit including first and second delay elements, the first delay element receiving the output of said comparison circuit and supplying an output to the second delay element, said logic circuit performing the logic functions:

$J = Q1 \ \& \ Q2 \ \& \ \text{Input}$ $K = Q1^* \ \& \ Q2^* \ \& \ \text{Input}$ where Q1 and Q2 are values stored by said first and second delay elements respectively, and "Input" is the binary value of the present pulse at the output of said comparison circuit.

* * * * *